(12) United States Patent
Komara et al.

(10) Patent No.: US 6,339,694 B1
(45) Date of Patent: Jan. 15, 2002

(54) METHOD AND APPARATUS EMPLOYING AUTOMATIC RF MUTING AND WIRELESS REMOTE CONTROL OF RF DOWNLINK TRANSMISSION FOR A WIRELESS REPEATER

(75) Inventors: Michael A. Komara; Thomas R. Schmutz; Jeffrey R. Nuckols, all of Indialantic, FL (US); Roger L. Overton, New York, NY (US)

(73) Assignee: Airnet Communications Corporation, Melbourne, FL (US)

( * ) Notice: Subject to any disclaimer, the term of this patent is extended or adjusted under 35 U.S.C. 154(b) by 0 days.

(21) Appl. No.: 09/280,542

(22) Filed: Mar. 30, 1999

Related U.S. Application Data (60) Provisional application No. 60/079,796, filed on Mar. 30, 1998.

(51) Int. Cl.⁷ .................................................. H04B 7/15
(52) U.S. Cl. ....................... 455/11.1; 455/343; 455/574
(58) Field of Search ........................... 455/9, 11.1, 418, 455/419, 420, 343, 572, 574, 67.1

(56) References Cited

U.S. PATENT DOCUMENTS 4,794,649 A * 12/1988 Fujiwara ..................... 455/343
5,483,672 A * 1/1996 Sasuta ......................... 455/574
5,884,196 A * 3/1999 Lekven et al. ............... 455/574

* cited by examiner

Primary Examiner—Nay Maung
Assistant Examiner—Quochien B. Vuong
(74) Attorney, Agent, or Firm—Akerman Senterfitt (57) ABSTRACT

A method and apparatus employing automatic radio frequency (RF) muting and wireless remote control of RF downlink transmission is disclosed for the protection of a downlink amplifier of a wireless repeater system. The present invention has broad application in systems where a RF controller controls the function of a remote RF re-transmitter. A control module in the remote RF re-transmitter disables a downlink amplifier when a initial power-up, power reset, or transmission lull occurs. A control signal from the RF controller enables the downlink amplifier when the RF controller is ready to transmit. In another embodiment of the present invention, a control module disables a downlink amplifier and automatic level control (ALC) of the remote RF re-transmitter during a initial power-up, power reset or transmission lull. When an enable signal is sent by the RF controller the control module enables the downlink amplifier and initializes the ALC with an initial attenuation values. In another embodiment of the present invention adapted to be used in a system with a base transceiver station and a remote RF cell controller. The system conforms with the GSM-900, GSM-1800, and GSM-1900 standards.

19 Claims, 7 Drawing Sheets

METHOD AND APPARATUS EMPLOYING AUTOMATIC RF MUTING AND WIRELESS REMOTE CONTROL OF RF DOWNLINK TRANSMISSION FOR A WIRELESS REPEATER

This application claims benefit of U.S. provisional application serial No. 60/079,796, filed Mar. 30, 1998.

FIELD OF THE INVENTION

This invention relates generally to wireless communication systems. In particular, it relates to the automatic muting and wireless remote control of re-transmitted downlink radio frequency (RF) signals in a wireless system repeater. More particularly, this invention relates to automatic muting and wireless remote control of re-transmitted downlink radio frequency (RF) signals in a translating wireless system repeater

BACKGROUND OF THE INVENTION

A cellular communication network provides its subscribers a method of communication in a given geographic area. The cellular communication network has certain advantages over a conventional phone system including increased service capability, better service performance, and efficient frequency spectrum utilization.

Figure 9:
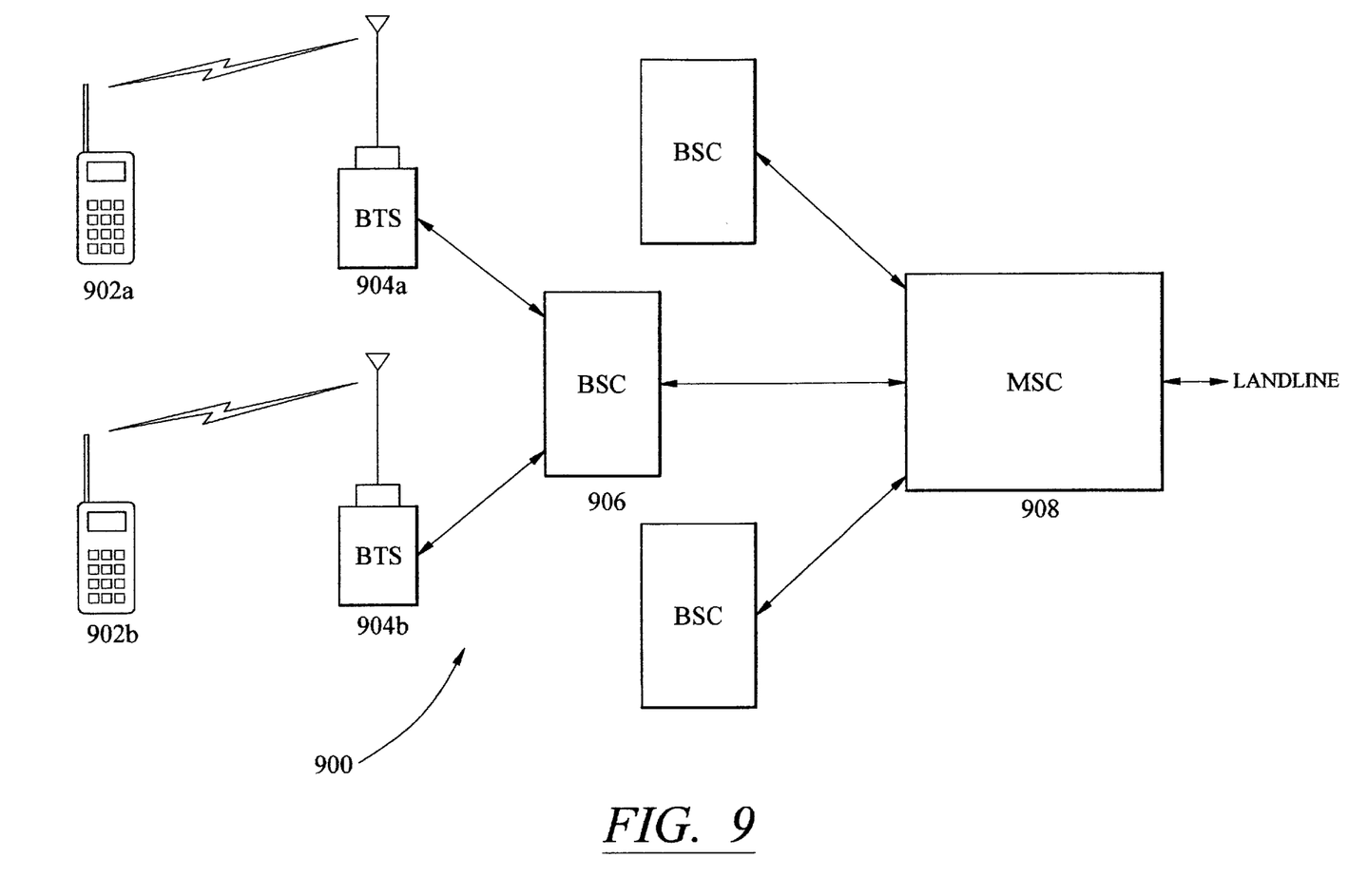
FIG. 9 illustrates a typical cellular communication network.

FIG. 9 illustrates a typical cellular communication network.

A typical cellular communication network 900 can be thought of as a hierarchical network. A subscriber typically carries a mobile unit 902a such as a cellular phone. The mobile unit 902a provides the user access to the cellular communication network 900. In order to gain access to the cellular communication network 900, the mobile unit 902a interfaces with a base transceiver station (BTS) 904a.

The BTS 904a provides coverage for multiple subscribers in a specific geographic area, called a cell. As the mobile unit 902a enters the cell, the BTS 904a and the mobile unit 902a communicate with one another. Information from this initial communication is used by the cellular communication network 900 so that it can route calls to and from the mobile unit 902a.

The BTS 904a has a limited coverage area. As a result, one technique for providing coverage for a large geographic area is to install multiple BTS units. In order to control and coordinate the multiple BTS units exemplified by 904a, 904b, they are interfaced with a base station controller (BSC) 906. The BSC 906 controls the wire and radio link between the BTS 904a, 904b and a Mobile Switching Center (MSC) 908.

The MSC 908 performs call processing functions such as transcoding and soft-hand-off. Since the MSC 908 has a location register, it also provides the location information necessary to track the location of the subscriber's mobile unit 902a throughout the cellular communication network 900. The MSC 908 also provides an interface to an external network. The external network is typically a landline phone network such as the public switched telephone network (PSTN) or integrated services digital network (ISDN).

Because cellular communication is based on electromagnetic wave propagation, there is a problem with propagation loss. As electromagnetic waves propagate, the strength or power of the signal decreases rapidly as a function of the distance the electromagnetic waves travel from their source. As a result, when subscribers move to the edge of a cell of a BTS, their calls are sometimes unclear due to weak signals, or they are dropped completely. To help alleviate this problem, providers of cellular communications networks have come up with several solutions.

One method of providing improved signal strength is to install additional BTSs. A higher density of BTS installations will insure that the subscriber is always relatively close to a BTS, which in turn insures adequate signal strength. However, a major drawback to this solution is the high cost of a BTS.

Another solution is to use repeaters, which are considerably lower cost than a BTS, within the cellular communication network. Generally, repeaters receive a downlink signal from a BTS and re-transmit the downlink signal to a mobile unit after the downlink signal has been amplified by a downlink amplifier in the repeater. The process works similarly in reverse, where the repeater will amplify an uplink signal from the subscriber to the BTS with an uplink amplifier. The amplifiers provide an increase in signal strength which improves the clarity of the calls and prevents dropped calls. To distinguish the direction of the signals transmitted and received by the repeaters, the path between the repeater and the BTS is referred to as the "backhaul" signal path.

As attractive as the use of repeaters are, they have a drawback. A repeater located remotely from its host BTS often has a fixed gain in both the downlink path (signal traveling from the BTS to the repeater) and uplink path (signal traveling from the repeater to the BTS). The amount of gain for each path is designed to compensate for the propagation loss suffered by the signals as they travel the fixed distance between the BTS and the repeater. The amount of fixed gain for each path is normally set at the time of installation and is not adjusted again. In the downlink path, the gain is most commonly based on the predictably weak signal power of the backhaul downlink signal received from the BTS. The amount of fixed gain is designed to amplify that incoming downlink backhaul signal to the maximum allowable downlink retransmit power of the repeater. The fixed gain creates a problem when an incoming signal with an unexpectedly high signal strength gets amplified, creating too high of an output level for the amplifiers, and a destructive phenomenon called saturation occurs. Operating an amplifier in saturation can damage the amplifier.

In order to protect the repeater's amplifier, some repeaters have a power limiting circuit that is designed to prevent the output level from becoming too strong and saturating or damaging the repeater's amplifiers. Another way to protect the amplifier is to use automatic level control (ALC) circuitry.

ALC is a technique which may be used in both the downlink and uplink paths of the repeater. In order to maintain optimum performance of the amplifier, it is desirable that the output of the amplifier perform within a certain range. The ALC assists in this function by sampling the input signal and if the input signal is within a specific range of input signal values, then the gain of the amplifier is not changed. However, if the input signal strength is above the upper limit of the input signal range, then the gain of the amplifier is reduced. If the input signal strength is below the lower limit of the input signal range, then the gain of the amplifier is increased. The sampling and comparison of the input signal strength can be performed by a processor such as a microprocessor or digital signal processor (DSP). The ALC can also be implemented by standard analog feedback techniques.

Although a repeater with ALC is an improvement over fixed gain repeaters, it is still not a complete solution. When ALC is used in a repeater downlink path, a problem arises when the downlink backhaul signal from the BTS is not present. The ALC responds to the missing downlink backhaul signal by measuring the input signal noise as a very low input signal level, and automatically adjusting itself to the maximum gain setting. While the downlink backhaul signal from the BTS is missing, the ALC may inadvertently amplify and re-transmit the input noise floor to a relatively high level which is undesirable. Furthermore, when the downlink backhaul signal to the repeater is restored, with the ALC gain at the maximum setting, the output amplifier can become very saturated and possibly be damaged.

To overcome the above stated problem, one solution has been to shut off the repeater's output amplifier until the ALC had adjusted itself to the proper attenuation/gain setting. This output enable-and-disable function could be performed in response to commands received via a telephone line and modem, but this requires additional hardware, a phone line installation charge, and monthly billing expenses.

DESCRIPTION OF THE INVENTION

Objects of the Invention

It is an object of this invention to provide a wireless system architecture whereby high efficiency broadband transceiver systems can be deployed at an initial build-out stage of the system in a cost-efficient manner.

A second object of the invention is to provide for automatic level control in a wireless system repeater while preventing saturation of output amplifiers in a wireless system repeater.

Another object of the invention is to provide protection against saturation of output amplifiers in a wireless system repeater with minimum hardware installation.

It is a further object of the present invention to provide all of the above-described advantages in a wireless system repeater translator.

SUMMARY OF THE INVENTION

Briefly, the invention features automatic RF muting and wireless remote control of the re-transmitted downlink RF signal in a wireless system repeater, in order to achieve the objects of the invention listed above. The ALC is controlled to set the initial gain at a safe setting and the output RF amplifier is disabled at initial startup until it receives a remote wireless enable signal. Accordingly, the requirements of a modem and a dedicated telephone line to the site, as well as the corresponding installation and monthly costs associated with that modem and phone line are eliminated.

This invention allows the ALC to be initialized at a safe setting, i.e. at a setting where variations in input signal strength will not result in output amplifier saturation. Further, the invention permits the output RF amplifier to be disabled at startup until it receives a remote wireless enable signal. This provides safe operation of the expensive high power amplifier component of the repeater unit.

BRIEF DESCRIPTION OF THE DRAWINGS

Features and advantages of the present invention will become apparent to those skilled in the art from the following description with reference to the drawings, in which.

DETAILED DESCRIPTION OF ILLUSTRATIVE EMBODIMENTS

The present invention provides a measure of protection between a radio frequency (RF) controller and a RF re-transmitter by an automatic muting and wireless remote control of the re-transmitted downlink RF signal. It will be readily apparent to those skilled in the relevant art that the invention described herein is the specific combination of functions described below, which may be performed by employing hardware components well known in the relevant art.

Figure 1:
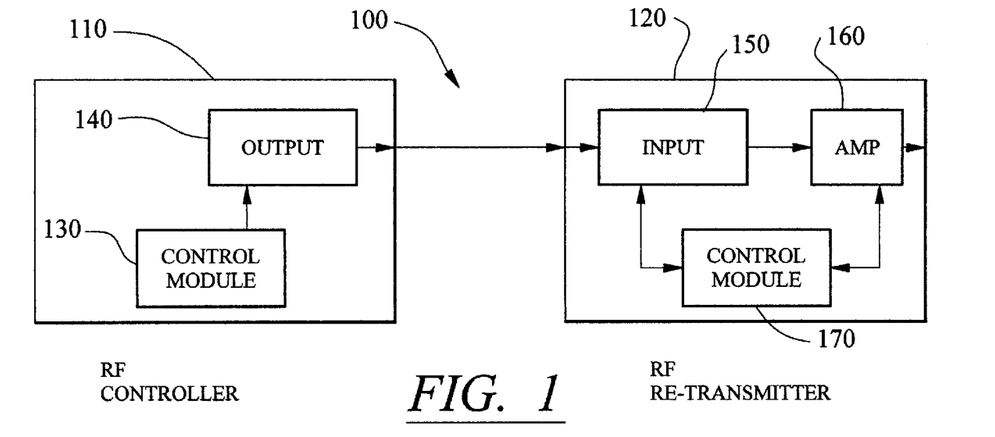
FIG. 1 is an illustration of the present invention in a system with a controller and a RF re-transmitter.
Figure 2:
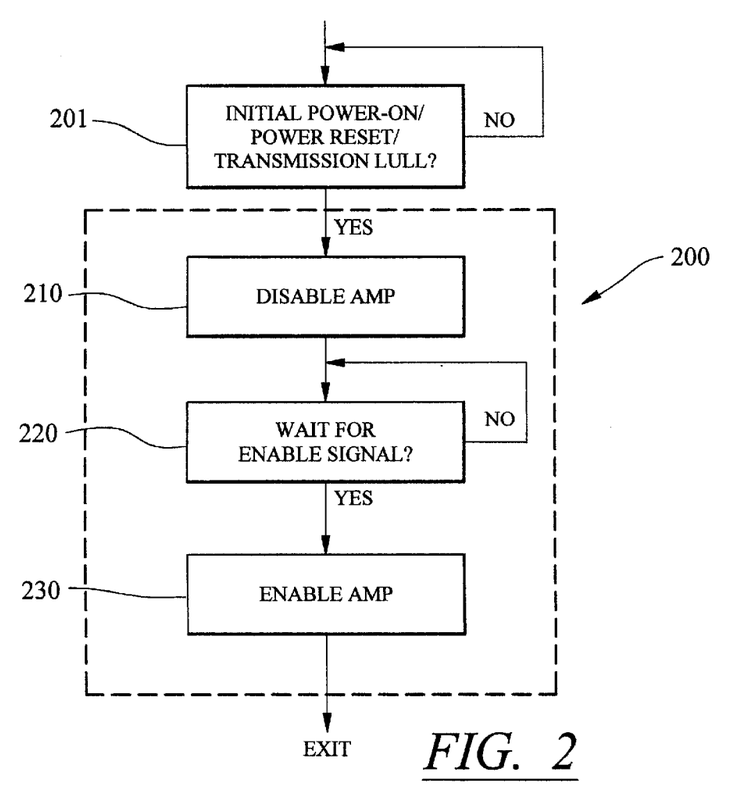
FIG. 2 is a block diagram of a muting module which embodies the present invention.

FIG. 1 shows a RF control system 100 with a RF controller 110 and a RF re-transmitter 120 and FIG. 2 shows one embodiment of the automatic RF muting and wireless remote control of the re-transmitted downlink RF signal in accordance with the principles of the present invention.

In the disclosed embodiment, the RF controller 110 is a controller which transmits control and data downlink signals to a RF re-transmitter 120. The RF controller 110 has a control module 130. The RF controller also has an output transmitter 140. The output transmitter 140 transmits the control and data downlink signals to the RF re-transmitter 120.

The control module 130 is a hardware/software module which controls the operation of the RF controller 110. The control module 130 also monitors the operation of the RF re-transmitter 120. If the RF re-transmitter 120 deviates from normal operation, the control module 130 will transmit control signals to bring the RF re-transmitter 120 back to normal operation.

The RF re-transmitter 120 is used to amplify and propagate voice and data downlink signals. The RF re-transmitter 130 has an input signal receiver 150 which is used to receive the control and data RF signals from the RF controller 110. The input signal receiver 150 passes the voice and data downlink signals to the amplifier 160. The amplifier 160 amplifies the data downlink signal and transmits the data downlink signal.

The RF re-transmitter 120 includes a control module 170. The control module 170 contains the software/hardware necessary to control the operation of the RF re-transmitter 120. FIG. 2 graphically depicts the functions executed by the control module 170, within which a muting module 200 executes the RF muting functions of the present invention.

As the control module 170 of the RF re-transmitter 120 of FIG. 1 executes its programmed functions, there are several conditions which may cause the control module 170 to execute the specific functions of the muting module 200. One such situation is where the RF re-transmitter is initially powering on, for example at system startup or after a power outage 201. The muting module functions may also be executed after the control module 170 detects a period of inactivity between the RF controller and RF re-transmitter 201. If any of these three conditions are met, the control module 170 executes the functions of the muting module 200.

After identifying one of the above-stated conditions, the muting module 200 disables the amplifier 210. By disabling the amplifier 210, the RF re-transmitter 120 is unable to re-transmit any signals. In effect, the RF re-transmitter 120 is muted. After the amplifier is disabled, the muting module 200 waits for a control signal from the RF controller 110.

When the control module 130 in the RF controller 110 is ready to transmit a downlink voice or data signal for re-transmission, the control module 130 will send a control signal 220 such as a continuous wave (CW) tone to the RF re-transmitter 120.

When the RF re-transmitter 120 receives the control signal 220, the muting module enables the amplifier 230. The control module 170 then exits the muting module 200 and returns to normal operation.

Thus, this embodiment of the invention protects the output amplifiers of the RF re-transmitter 120 during initial power-on, a power reset, or a transmission lull. The invention achieves this protection by disabling the output amplifiers until remotely enabled, to prevent any spurious high-energy spikes resulting from high gain amplification of signal noise, which can cause potentially destructive saturation in the output amplifiers.

Figure 3:
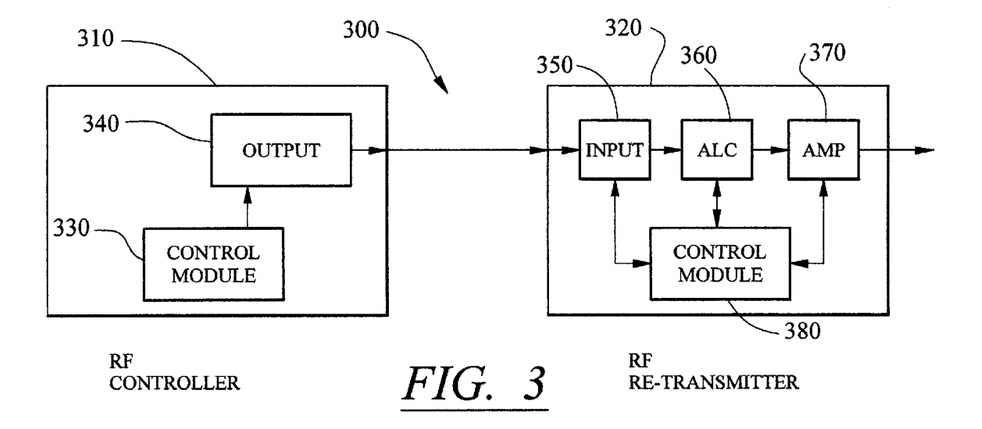
FIG. 3 illustrates another aspect of the present invention in another system with a RF controller and a RF re-transmitter with ALC.
Figure 4:
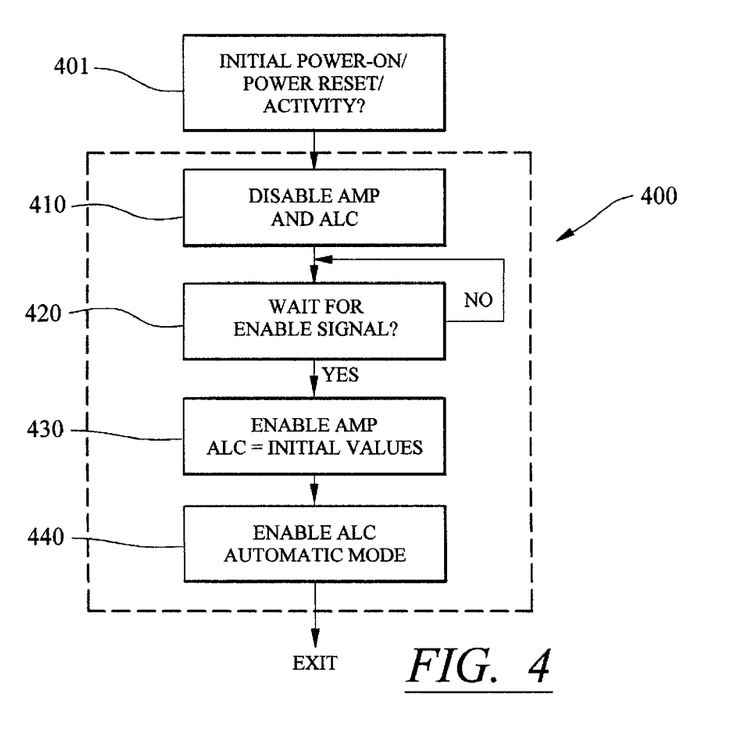
FIG. 4 is a block diagram of a muting module used in the system of FIG. 3.

FIG. 3 shows another embodiment of a RF control system 300 with a RF controller 310 and a RF re-transmitter 320 with ALC circuitry 360, and FIG. 4 shows another embodiment of the automatic RF muting and wireless remote control of the re-transmitted downlink RF signal in accordance with the principles of the present invention.

In the disclosed embodiment, the RF controller 310 is a controller which transmits control, voice, and data downlink signals to a RF re-transmitter 320. The RF controller 310 has a control module 330. The RF controller also has an output transmitter 340. The output transmitter 340 is used to transmit the control, voice, and data downlink signals to the RF re-transmitter 320.

The control module 330 is a hardware/software module which controls the operation of the RF controller 310. The control module 330 also monitors the operation of the RF re-transmitter 320. If the signal strengths measured at the RF re-transmitter 320 deviate from programmed normal operating limits, then the control module 330 will transmit control signals to bring the signal strengths at the RF re-transmitter 320 back to within normal operating limits.

The RF re-transmitter 320 is used to amplify and propagate voice and data downlink signals. The RF re-transmitter 320 has an input signal receiver 350 which is used to receive the control, voice, and data RF signals from the RF controller 310. The input signal receiver 350 passes the received downlink signals to the ALC 360 which adjusts the gain of the output amplifier 370. The output amplifier 370 amplifies the downlink signal and re-transmits the downlink signal at a higher power level.

In most conventional uses of an ALC, the typical ALC is not calibrated to insure that the amplifier does not go into saturation. When an input signal is missing, the conventional ALC interprets noise as an extremely weak signal, and accordingly sets the gain of any output amplifiers to maximum. Therefore, when a signal is subsequently received at a power level higher than the signal noise floor, the ALC causes that signal to be amplified at maximum gain, which may place the amplifier into saturation and possibly damage the amplifier. To overcome this problem, the present invention contemplates setting the ALC 360 with initial attenuation values to prevent saturation.

To accomplish this goal, a maximum input signal level of the backhaul downlink signal from the RF controller 310 is measured at the input 350 of the RF re-transmitter 320 at the time of installation. The maximum level of the backhaul downlink signal is calibrated against the input range of the RF re-transmitter 320 to provide an initial attenuation value. For example, if the input range of the RF re-transmitter is −65 dBm to −95 dBm, then the maximum transmit level of the RF controller is typically adjusted to provide near the highest level, −70 dBm, at the input 350 of the RF re-transmitter 320, which indicates a flat fade margin of 25 dB and headroom of 5 dB. In the preferred embodiment of this aspect of the invention, the ALC 360 employs digital attenuation under microprocessor control, rather than standard analog feedback gain control techniques. The processor-controlled software is configured to initialize the ALC 360 to a setting so that the re-transmit power from the output amplifiers of the RF re-transmitter 320 is maximized. Thus, if the maximum backhaul downlink input signal level measured at the input 350 of the RF re-transmitter 320 is −70 dBm, then the ALC 360 is initialized with 25 dB of attenuation. However, if the maximum backhaul downlink input signal level measured at the input 350 of the RF re-transmitter 320 is −80 dBm, then the initial attenuation value is 15 dB. Similarly, if the maximum backhaul downlink input signal level measured at the input 350 of the RF re-transmitter 320 is −95 dBm, then the initial attenuation value is 0 dB. Thus, with the initial attenuation value determined, the output amplifier 370 is protected from saturation and the downlink signal is always transmitting at full power.

The RF re-transmitter 320 includes a RF re-transmitter control module 380. The RF re-transmitter control module 380 contains the software/hardware necessary to control the operation of the RF re-transmitter 320. FIG. 4 graphically depicts the functions executed by the RF re-transmitter control module 380, within which a muting module 400 executes the RF muting and amplifier enabling functions of the present invention.

As the RF re-transmitter control module 380 of the RF re-transmitter 320 in FIG. 3 executes its programmed functions, there are several conditions which may cause the RF re-transmitter control module 380 to execute the specific functions of the muting module 400. One such situation is where the RF re-transmitter 320 is initially powering on, for example at system startup, or after a power outage 401. The functions of the muting module 400 may also be executed after the RF re-transmitter control module 380 detects a period of inactivity 401 between the RF controller 310 and the RF re-transmitter 320. If any of these three conditions are met, then the RF re-transmitter control module 380 executes the functions of the muting module 400.

After identifying one of the above-stated conditions that cause the execution of the muting module 400, the muting module 400 disables the amplifier and the ALC 410. Disabling the amplifier prevents the RF re-transmitter 320 from transmitting. In effect, the RF re-transmitter 320 is muted. The muting module 400 then executes a loop where it waits for a control signal from the RF controller 420.

When the control module 330 in the RF controller 310 is ready to transmit a downlink signal for re-transmission, the control module 330 will send a control signal such as a continuous wave (CW) tone to the RF re-transmitter 320.

When the RF re-transmitter 320 receives the control signal 420, the muting module 400 enables the amplifier and initializes the ALC with the initial attenuation value 430. Finally, the muting module 400 replaces the ALC in an automatic mode 440 and the RF re-transmitter control module 380 exits the muting module 400 and returns to normal operation, awaiting the next signal from the RF controller 310.

Thus, this embodiment of the invention protects the output amplifiers of the RF re-transmitter 320 during initial power-on, or after a power reset, or transmission lull by presetting the ALC with an initial attenuation value and disabling the amplifiers until remotely enabled to prevent amplifier saturation and possible associated damage.

Figure 5:
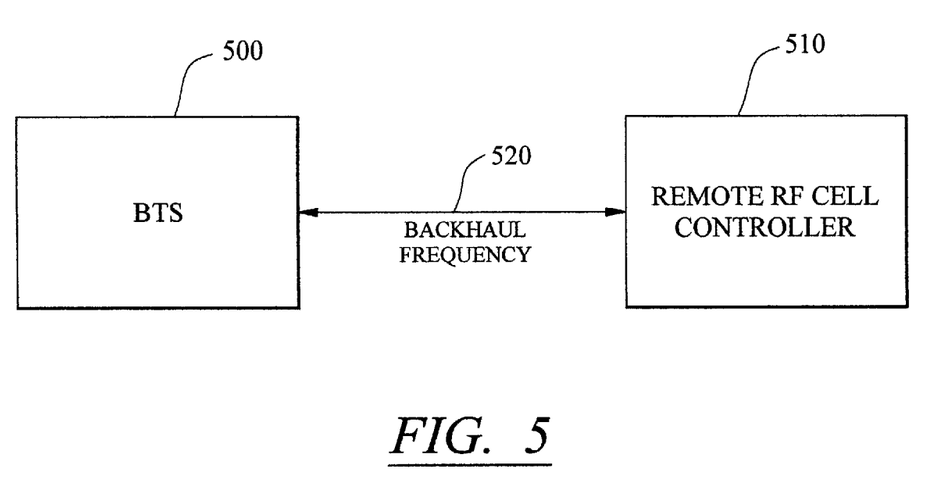
FIG. 5 is a block diagram of another embodiment of the present invention with a base transceiver station and a remote RF cell controller.

FIG. 5 is a block diagram of another embodiment of the present invention with a base transceiver station 500 and a remote RF cell controller 520.

In this particular embodiment of the present invention, the present invention is adapted to conform to the Global System for Mobile Communications (GSM) wireless communication standards: GSM-900, GSM-1800, and GSM-1900. The present invention is also capable of compliance with any other wireless telecommunications standards, including but not limited to IS41, PCS, and any proprietary standards where the present invention can be applied.

A base transceiver station (BTS) 500 transmits control and data RF signals to a remote RF cell controller 510 over a backhaul frequency 520. In normal operations, a modulated Gaussian Minimum Shift Keyed (GMSK) carrier from the base station 500 is continuously transmitted in the backhaul downlink to the remote RF cell controller 510. This signal is received by the remote RF cell controller 510 at a power level from −65 dBm to −95 dBm via a directional antenna, amplified, filtered, shifted in frequency, filtered again, level-controlled, and amplified to a high power level (e.g., +43 dBm to +46 dBm). This remote ground downlink signal is typically transmitted via an omni-directional antenna to the mobile subscriber.

Figure 6:
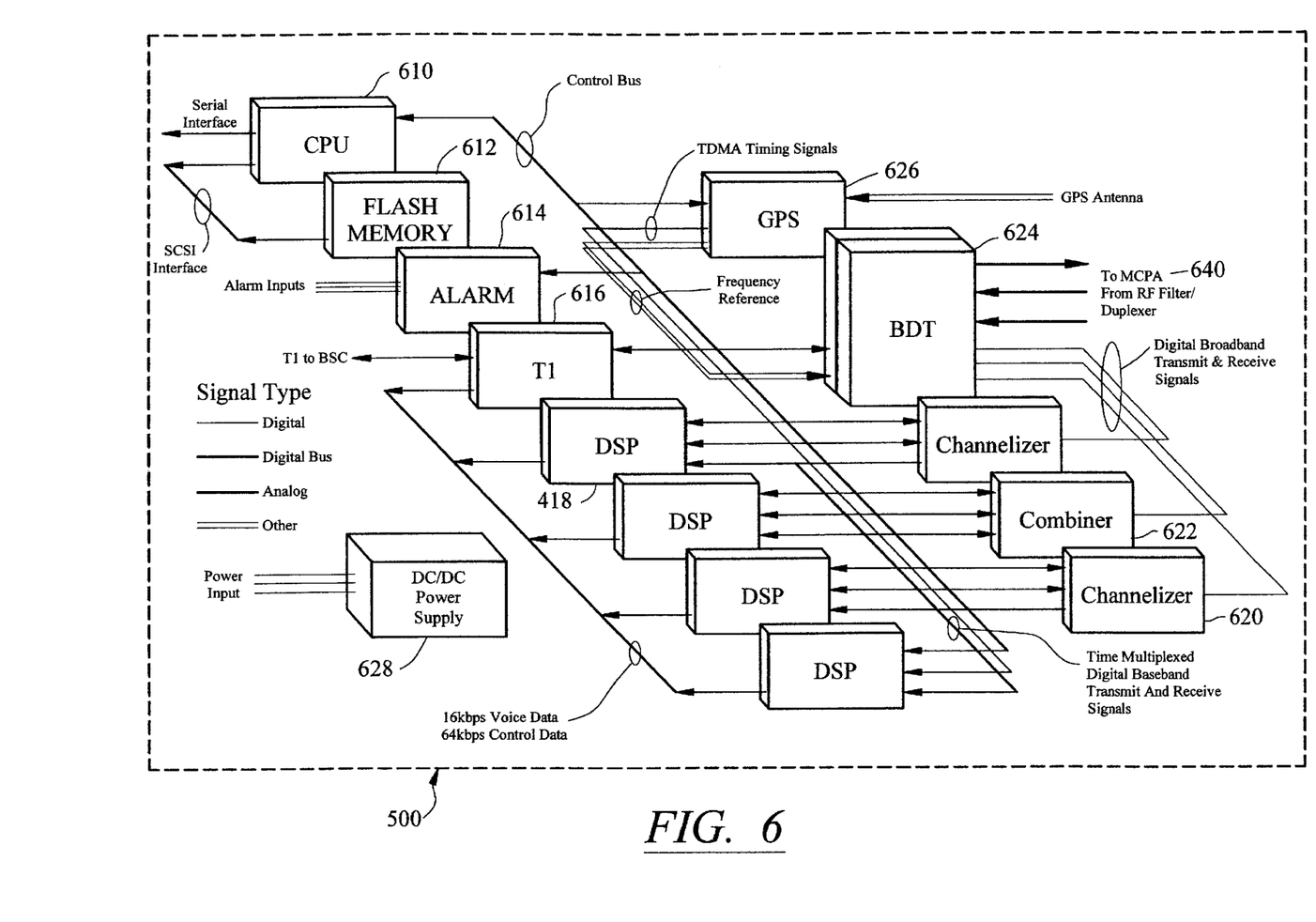
FIG. 6 is a general block diagram of the base transceiver station of FIG. 5.

FIG. 6 is a general block diagram of the base transceiver station of FIG. 5.

The BTS 300 contemplated by this embodiment of the invention differs from previous prior art versions of base transceiver stations. The architecture of BTS 500 is based on a software designed radio. This is an improvement over prior art base transceiver stations because it allows for the operation of the BTS 500 to be altered simply by loading new instructions.

The BTS 500 has a central processing unit (CPU) 610. The CPU hosts all of the BTS low-level control, call processing, and operation and maintenance application software.

The BTS 500 includes a flash memory module 612. The flash memory module 612 provides non-volatile storage of the real-time operating system and application software for the CPU and DSP modules 618. The flash memory module 612 also provides for specific configuration parameters for the BTS. During boot up or upon command, the BTS validates the revision of software storage in the flash memory module 612 with a higher network entity such as a BSC. If the versions differ or if there is an error, then the correct software version is downloaded to the BTS and stored on the flash memory module 612.

An alarm module 614 is part of the architecture of the BTS 500. The alarm module 614 provides for detection and control of devices internal and external to the BTS 500. Internally, the alarm module 614 monitors a multi-carrier power amplifier (MCPA), not shown, for fault conditions, a DC/DC power supply 628 for correct input and output voltages, as well as temperature and air flow sensors. Externally, the alarm module 614 can monitor a bulk power system, security alarms, environmental alarms, fire, and other alarms.

A network interface module 616 is provided for the BTS 500. The network interface module 616 provides a single T1 for an A-bis connection to a base station controller (BSC). This module supports up to ninety-two (92) 16 kps sub-rate voice channels as well as a LAPD signaling channel across the A-bis interface to the BSC.

The BTS 500 has at least one digital signal processor (DSP) module 618. The DSP module 618 performs equalization, demodulation, and channel decoding from received channels of RF carriers that have been down-converted to a baseband signal by a BTS channelizer module 620. Likewise, it performs channel coding and modulation of 13 kps voice channel data from the network interface module 614. The DSP module 618 time-division multiplexes 8 channels into a single baseband signal for up-conversion and combining with other RF carriers by a BTS combiner module 622. Additionally, a DSP module 618 performs the functions necessary for control, paging, and access channels.

Furthermore, diversity processing is performed on each received channel by the DSP module 618. Providing diversity processing in the DSP module 618 via software allows for easy upgrades as new algorithms are developed to improve signal quality.

Finally, each DSP module 618 can process from one to three RF transmit signals and the BTS 500 will support up to four DSP modules 618.

The channelizer module 420 receives a digital composite IF signal from the BTS 500 from a broadband digital transceiver (BDT) 624. This composite signal consists of all of the 200 kHz RF carriers in a 5 MHz bandwidth. The channelizer module 620 filters and down-converts each RF carrier to a baseband signal for processing by the DSP module 618. The digital filter within the channelizer module 620 is software programmable, which provides significantly more flexibility and control for out-of-band signal rejection than analog filtering used in conventional base transceiver stations.

Additionally, the channel bandwidth or spacing of the channelizer module 620 is also software programmable, allowing it to be used with other air-interface protocols with channel spacing other than 200 kHz as used with the GSM protocols.

The BTS 300 provides for two channelizer modules 620 for spatial antenna receive diversity. The digital RF carrier signals from each channelizer module 620 are transferred to the same DSP module for diversity processing.

The combiner module 622, mentioned above, is the third element of the software designed radio of the BTS 500. The combiner module 622 performs the reciprocal function of the channelizer module 620. Baseband RF carriers are received from the DSP module 618. Each carrier is filtered and up-converted to a unique IF. All of the RF carriers in a 5 MHz bandwidth are simultaneously combined into a single composite IF signal. This digital IF is transferred to the BDT 624 for up-conversion to the appropriate RF band.

The BDT 624 of the BTS 300 consists of two wideband receivers, for diversity, and one wideband transmitter. Each receiver within the BDT 624 accepts at least a 5 MHz contiguous block of RF frequencies and down-converts the block to an IF center frequency. This IF signal is then digitized by a high performance analog-to-digital converter and the digital signal is transferred to the channelizer module 620 for de-multiplexing of individual RF carriers and further down-conversion to baseband.

On the transmit side, the BDT 624 receives a digital broadband signal from the combiner module 622. It converts this signal to analog with a high performance digital-to-analog converter. This IF signal is then up-converted to the appropriate RF frequency.

Finally, the 5 MHz bandwidth of the BDT 624 is software tunable anywhere across the RF band of the allocated spectrum.

The BTS 500 has a Global Positioning System (GPS) module 626. The module provides an extremely accurate and low cost frequency reference used by the BDT 500. With the frequency reference, no periodic maintenance is required to calibrate the BDT 500. Traditional transceiver systems typically require periodic adjustment to maintain frequency accuracy.

Additionally, the GPS module 626 provides the time alignment for the time division multiplexing access (TDMA) time slots of the RF signals. This allows for the synchronization of multiple BTSs, providing smoother, faster hand-overs between cells.

Since only time information and not position data is required from the GPS system, the BTS needs to track only one GPS satellite at a time. In the event of momentary loss of the GPS satellite signal, Kalman filtering within the GPS module 626 maintains frequency accuracy within the GSM-1900 standard for a period greater than 24 hours.

The BTS 300 unit is powered by a DC/DC power supply module 628. This module accepts +24 VDC from an external power supply and generates the voltages necessary to power the other individual modules of the BTS 500.

The BTS 500 also includes a RF filter/duplexer module (not shown) 630. The RF filter/duplexer module 630 filters RF signals within a specific GSM-1900 band. The RF filter/duplexer module 630 outputs two received signals, one from each of its diversity receive antenna inputs, to the BDT 624. Likewise, it interfaces to the high power amplifier's output and combines this transmit signal with one of the receive inputs, implementing the duplex function. This allows a single antenna connection for the transmit and one of the diversity receive RF signals.

Finally, the BTS 500 has a multi-carrier power amplifier (MCPA) 640 (not shown). The MPCA 640 is an ultra-linear, multi-carrier, high power amplifier. It receives the composite broadband RF transmit signal from the BDT 624 and provides as much as 48 dB of gain. The power output of individual RF carriers are determine by downlink power control algorithms entirely within the BTS 500.

The remote RF cell controller 510 implements the functionality of prior art base transceiver stations. However, as prior art base transceiver stations are multiple RF channels, the remote RF cell controller has a single RF channel with an integrated backhaul transceiver. The remote RF cell controller 510 also has the feature of being a frequency translating repeater. The remote RF cell controller 510 receives a mobile subscriber's uplink signal, translates it to a backhaul frequency, and transmits the signal to a BTS 500. Likewise, the reverse operation is performed. The BTS 500 transmits the downlink signal intended for the mobile subscriber on an in-band backhaul frequency. The remote RF cell controller receives the signal, translates it to the downlink frequency of the mobile subscriber, and transmits it to the mobile subscriber at high power.

Figure 7:
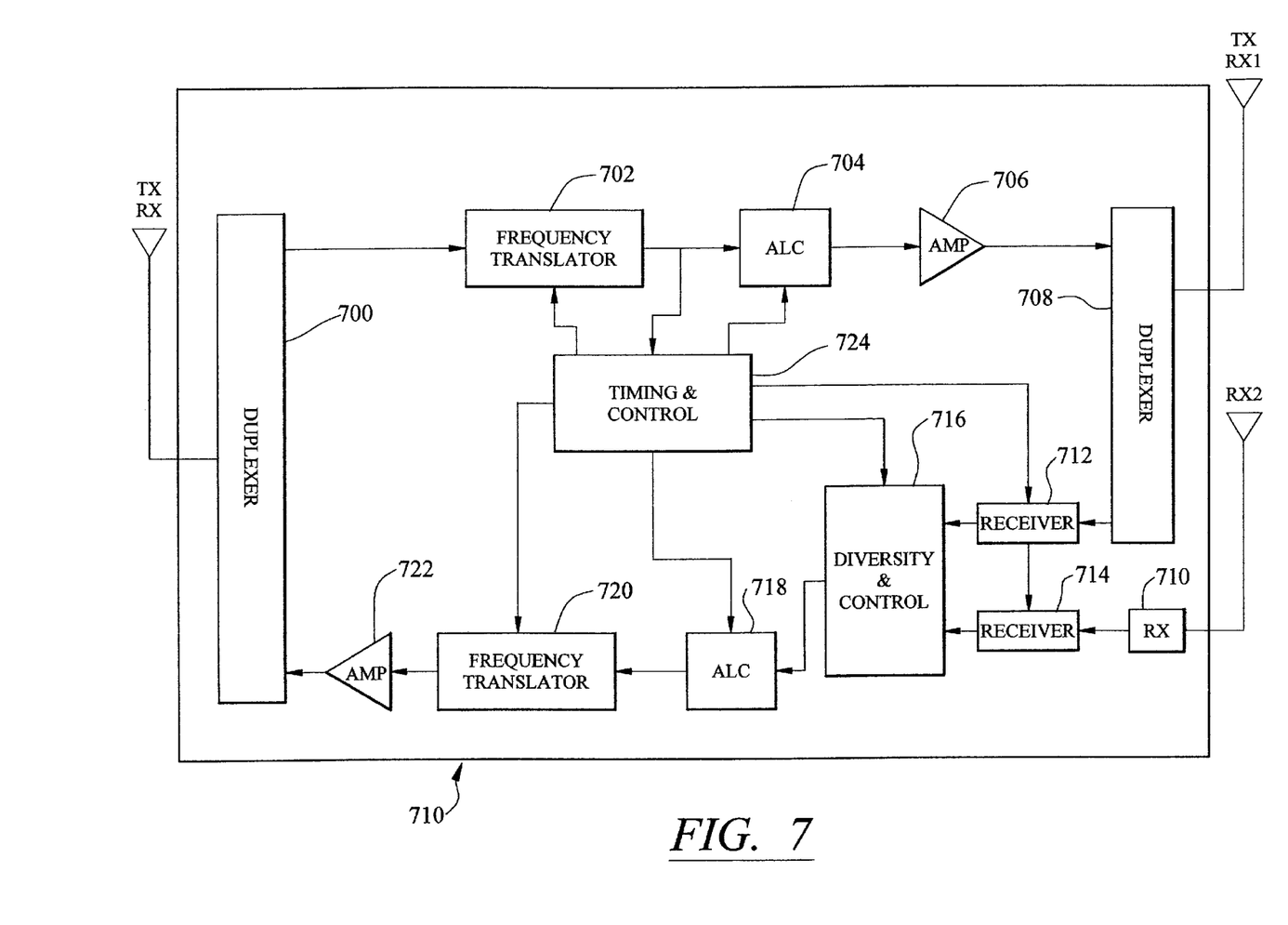
FIG. 7 is a block diagram of the remote RF cell controller of FIG. 5.

FIG. 7 is a block diagram of the remote RF cell controller of FIG. 5.

The remote RF cell controller 510 can be thought of as having two paths: a downlink and uplink path. In the downlink path, an RF signal from the BTS 500 is received at the duplexer 700. The duplexer 700 has an input range of −65 dBm to −95 dBm. The duplexer 700 filters the received RF signal and also provides the isolation from an uplink signal, allowing a single antenna connection for both the uplink and downlink backhaul signals.

The received RF signal is passed to a frequency translator 702. The frequency translator translates the received RF frequency from the backhaul frequency to the mobile subscriber frequency. The translated received RF signal is passed to a downlink ALC 704.

The downlink ALC 704 samples the received RF signal to adjust the gain of a downlink amplifier 706. After the received RF signal is amplified by the downlink amplifier 706, it is passed to a mobile duplexer 708.

The downlink ALC 704 uses digital attenuation under microprocessor control rather than a standard analog feedback gain control topology. The downlink ALC 704 is also initialized with a preset attenuation value. At the time of installation, a maximum receive level at the duplexer 700 is measured. This maximum receive level is calibrated against the input range of the duplexer 700. If the maximum receive level of the BTS 500 is −65 dBm, then the initial attenuation value is 30 dB. If the maximum transmit level of the BTS 500 at the duplexer 700 is −95 dBm, then the initial attenuation level is 0 dB. With the downlink ALC 704 initialized with a preset attenuation value, the downlink amplifier 706 is protected from being driven into saturation.

The mobile duplexer 708 filters the received uplink RF signal from the mobile subscriber and transmits the downlink RF signal to the mobile subscriber. The mobile duplexer 708 also provides isolation between uplink and downlink signals of the mobile subscribers.

The uplink path of the remote RF cell controller 510 begins with a received uplink signal from the mobile subscriber via the mobile duplexer 708. The uplink signal is filtered by the mobile duplexer 708 and passed to a receiver 712.

The uplink signal is also received by a second receive-only filter 710. The receive-only filter isolates the uplink signal and passes it on to a second receiver 714.

The uplink signal from both receivers 712, 714 is passed to a diversity circuit 716. The diversity circuit 716 selects the strongest signal on a GSM time slot basis.

From the diversity circuit 716, the uplink signal is passed to an uplink ALC 718. The uplink ALC samples the input to adjust the gain of an uplink amplifier 722. Prior to amplification, the uplink signal is passed to an uplink frequency translator which translates the uplink signal from the mobile subscriber frequency to the backhaul frequency.

The translated uplink signal is then passed to the uplink amplifier 722, filtered by the backhaul duplexer 700, and passed through the antenna.

The remote RF cell controller 510 is controlled by a timing/control module 724. The timing/control module 724 provides the necessary hardware and software to perform all the functionality of the remote RF cell controller 510. The timing/control module 724 contains one embodiment of the present invention which provides the automatic RF muting and wireless remote control of a re-transmitted control downlink RF signal.

Figure 8:
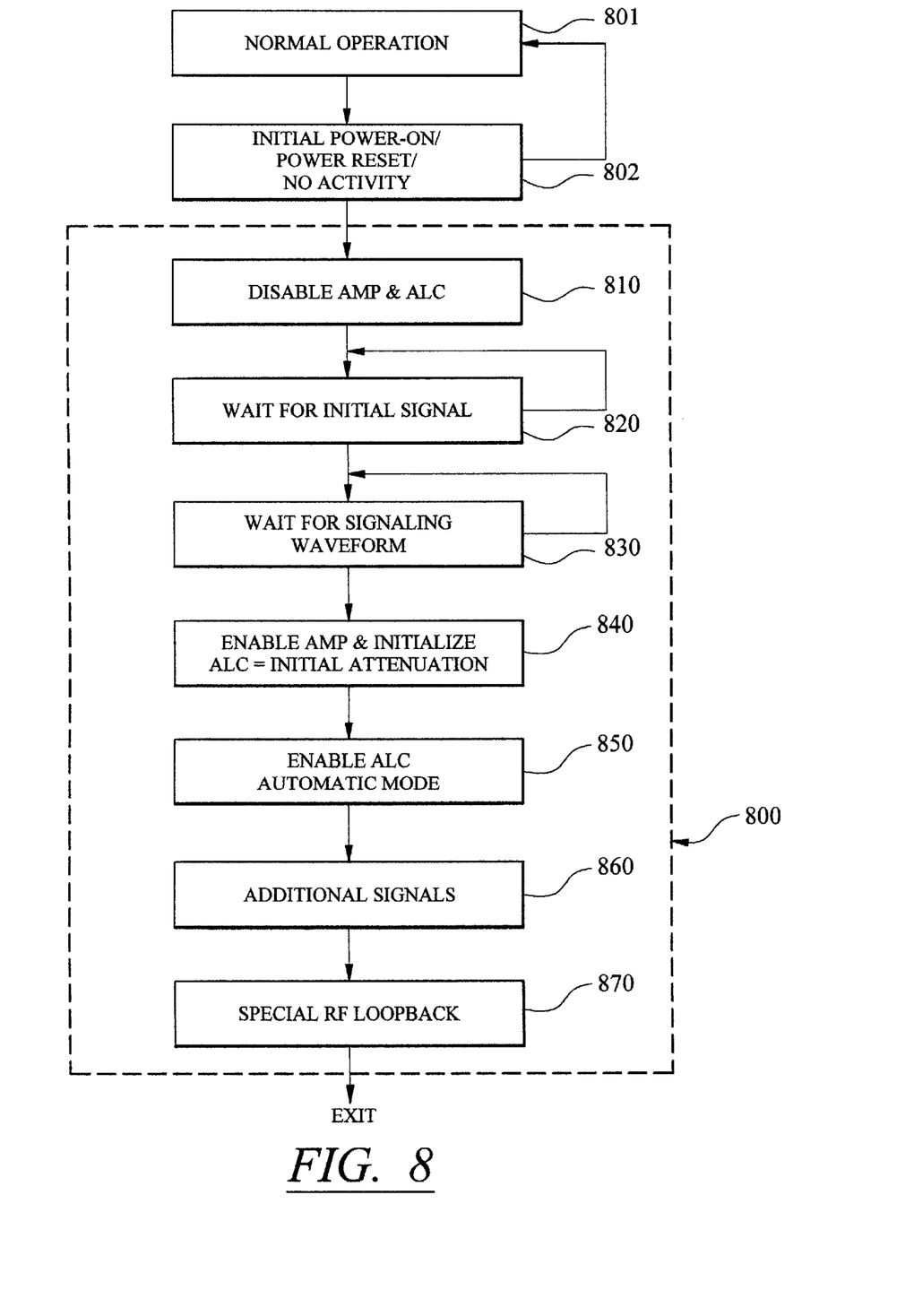
FIG. 8 is flow diagram of the present invention in the system of FIG. 5.

FIG. 8 is flow diagram of the present invention in the system of FIG. 5.

As the timing/control module 724 of the remote RF cell controller 510 executes within normal operation 801, there are several conditions which may cause the timing/control module 724 to enter a downlink muting module 800. One condition is where the remote RF cell controller 510 is initially powering up or after a power outage 802. The timing/control module 726 may also enter the downlink muting module if the timing/control module 726 detects a lack of activity on the backhaul frequency 802.

After the initial power-up, power reset, or lack of activity 802, as the downlink muting module 800 disables the downlink amplifier and disables the ALC operation 810. By disabling the downlink amplifier 706, the remote RF cell controller 510 cannot transmit downlink signals to the subscriber. In effect, the remote RF cell controller 510 is muted. Then, the downlink module 800 waits for a control signal from the BTS 500.

The BTS 500, as part of the application programming running on the CPU 610, monitors the operation of the remote RF cell controller 510. If the BTS 500 detects that the remote RF cell controller 510 is not responding to inquiries, then the BTS 500 will begin initiating communication to synchronize the remote RF cell controller 510.

The BTS may initially send a GSM-modulated waveform signal to initiate communication between the BTS 500 and the remote cell controller 820. This initial signal does not enable the downlink amplifier 706.

The BTS then transmits a "signaling waveform" such as a continuous wave (CW) tone over the backhaul downlink for a predetermined amount of time 830.

From the reception of the signaling waveform, the downlink muting module 800 enables the downlink amplifier and initializes the downlink ALC 704 with the initial preset attenuation value 840. The downlink muting module 800 also places the downlink amplifier under the control of the downlink ALC 850.

The downlink muting module 800 then waits for additional signaling waveforms from the BTS 860 to place the remote RF cell controller 510 into a special RF loopback mode 870 and the muting module 800 exits.

In this particular embodiment of the present invention, the invention allows the ALC to be initialized at a safe setting and the downlink amplifier to be disabled at initial turn-on, power reset, or transmission lull until it receives a remote wireless enable signal. This provides for safe operation of the downlink amplifiers.

While the invention has been described with reference to the exemplary embodiments thereof, those skilled in the art will be able to make various modifications to the described embodiments of the invention without departing from the true spirit and scope of the invention.

What is claimed is:

1. In a wireless communications system including a radio frequency (RF) re-transmitter, said RF re-transmitter adapted to receive and re-transmit wireless signals, said RF re-transmitter including an output amplifier and automatic level control circuitry, a method for limiting output power of said output amplifier, said method comprising:

disabling said output amplifier and said automatic level control circuitry while awaiting receipt of a wireless downlink enable signal;

receiving said wireless downlink enable signal from a RF controller;

initializing said automatic level control circuitry responsive to receipt of said wireless downlink enable signal to a preset level such that output power of said output amplifier does not exceed a predetermined level when said RF-transmitter begins re-transmitting; and enabling said output amplifier following said initializing, wherein said output power of said output amplifier does not exceed said predetermined level, whereby said output amplifier is protected from saturation and possible damage from excessive power dissipation upon turn on.

2. The method of claim 1, said method further comprising:
disabling said output amplifier when a control module of said RF re-transmitter detects a transmission lull between said RF controller and said RF re-transmitter.

3. The method of claim 1, said method further comprising:
disabling said output amplifier when said RF re-transmitter initiates a power up.

4. The method of claim 1, said method further comprising:
disabling said output amplifier when said RF re-transmitter initiates a power reset.

5. The method of claim 1, further comprising the step of placing said automatic level control circuitry in an automatic mode after said enabling step.

6. The method of claim 1, further comprising the steps of measuring received power of said wireless downlink enable signal, and adjusting a power level directed by said automatic level control circuit based on said received power level.

7. The method of claim 6, farther comprising a second wireless downlink enable signal, said second wireless downlink enable signal for turning on said output amplifier and placing said automatic level control circuitry in an automatic mode.

8. The method of claim 1, wherein said automatic level control circuitry employs digital attenuation under microprocessor control.

9. In a wireless communications systems including a radio frequency (RF) re-transmitter, said RF re-transmitter adapted to receive and re-transmit wireless signals, said RF re-transmitter including an output amplifier and automatic level control circuitry, a computer readable medium containing program instructions for limiting output power of said output amplifier, the program instruction including instruction for performing the steps comprising:

disabling said output amplifier and said automatic level control circuitry while awaiting receipt of a wireless downlink enable signal;

receiving said wireless downlink enable signal from a RE controller;

initializing said automatic level control circuitry responsive to receipt of said wireless downlink enable signal to a preset level such that output power of said output amplifier does not exceed a predetermined level when said RF-transmitter begins re-transmitting; and enabling said output amplifier following said initializing, wherein said output power of said output amplifier does not exceed said predetermined level, whereby said output amplifier is protected from saturation and possible damage from excessive power dissipation upon turn on.

10. The computer readable medium containing program instructions for controlling a RF re-transmitter of claim 9, wherein said program instructions further comprise:

disabling said output amplifier when a control module of said RF re-transmitter detects a transmission lull between said RF controller and said RF re-transmitter.

11. The computer readable medium containing program instructions for controlling a RF re-transmitter of claim 9, wherein said program instructions further comprise:

disabling said output amplifier when said RF re-transmitter initiates a power up.

12. The computer readable medium containing program instructions for controlling a RF re-transmitter of claim 9, wherein said program instructions further comprise:

disabling said output amplifier when said RF re-transmitter initiates a power reset.

13. In a wireless communications system including a radio frequency (RF) re-transmitter, said RF re-transmitter including an output amplifier and automatic level control circuitry, an apparatus for limiting output power of said output amplifier, said apparatus comprising:

means for disabling said output amplifier and said automatic level control circuitry while awaiting receipt of a wireless downlink enable signal;

means for receiving said wireless downlink enable signal from a RF controller;

means for initializing said automatic level control circuitry responsive to receipt of said wireless downlink enable signal to a preset level such that output power of said output amplifier does not exceed a predetermined level when said RF-transmitter begins re-transmitting; and means for enabling said output amplifier following said initialization, wherein said output power of said output amplifier does not exceed said predetermined level, whereby said output amplifier is protected from saturation and possible damage from excessive power dissipation upon turn on.

14. The apparatus of claim 13, said apparatus further comprising:

means for disabling said output amplifier when a control module of said RF re-transmitter detects transmission inactivity between said RF controller and said RF re-transmitter.

15. The apparatus of claim 13, said apparatus further comprising:

means for disabling said output amplifier when said RF re-transmitter initiates a power up.

16. The apparatus of claim 13, said apparatus further comprising:

means for disabling said output amplifier when said RF re-transmitter initiates a power reset.

17. A radio frequency (RF) re-transmitter adapted to receive and re-transmit wireless signals, comprising:

an output amplifier, and automatic level control circuitry, said automatic level control circuitry disabled while awaiting receipt of a wireless downlink enable signal, said automatic level control circuitry responsive to receipt of a wireless downlink enable signal to initialize to a preset level such that output power of said output amplifier does not exceed a predetermined level when said RF-transmitter begins re-transmitting, whereby said output amplifier is protected from saturation and possible damage from excessive power dissipation upon turn on.

18. The RF re-transmitter of claim 17, further comprising means for measuring received power of said wireless downlink enable signal, and means for adjusting a power level directed by said automatic level control circuit based on said received power level.

19. The RF re-transmitter of claim 17, wherein said automatic level control circuitry employs digital attenuation under microprocessor control.

* * * * *